United States Patent

[11] 3,581,237

[72] Inventor Masaharu Nakagawa
Tokyo, Japan
[21] Appl. No. 787,112
[22] Filed Dec. 26, 1968
[45] Patented May 25, 1971
[73] Assignee Alps Electric Company Limited
Tokyo, Japan
[32] Priority Mar. 28, 1968
[33] Japan
[31] 43/25002

[54] OSCILLATOR FEEDBACK CIRCUIT FOR USE IN UHF TUNER
10 Claims, 3 Drawing Figs.

[52] U.S. Cl. 331/117D, 317/242, 317/256, 334/78
[51] Int. Cl. H03b 5/18
[50] Field of Search 331/117, 117 D, 96, 101; 334/187, 78, 73

[56] References Cited

UNITED STATES PATENTS

| | | | |
|---|---|---|---|
| 2,459,638 | 1/1949 | Fyler | 331/187 |
| 3,140,444 | 7/1964 | Carlson | 331/117 |
| 3,159,798 | 12/1964 | Burns | 331/117 |
| 3,270,292 | 8/1966 | Harwood | 331/117 |
| 3,333,210 | 7/1967 | Valdettaro | 331/117 |

FOREIGN PATENTS

| | | | |
|---|---|---|---|
| 1,129,779 | 10/1968 | Great Britain | 331/117 |

*Primary Examiner*—John Kominski
*Attorney*—James and Franklin

ABSTRACT: An RF oscillator circuit comprises a capacitance in a feedback circuit connected between the output and input terminals of an amplifier. That capacitance is defined by a pair of overlying conductors respectively operatively connected to the amplifier input and output terminals.

PATENTED MAY 25 1971 3,581,237

INVENTOR
MASAHARU NAKAGAWA
BY James and Franklin
ATTORNEY

OSCILLATOR FEEDBACK CIRCUIT FOR USE IN UHF TUNER

The present invention relates to oscillator circuits, and particularly to a high frequency oscillator having a capacitance in its feedback circuit.

A tuned local oscillator is one of the basic components of a communications receiver using the heterodyning principle of operation. That oscillator generates the local oscillator (Lo) frequency which is mixed with a signal derived from the received RF signal to produce the IF signal. The latter is processed in other sections of the receiver to derive the intelligence signal which originally formed part of the RF signal. Oscillators of this type generally comprise an amplification stage and a resonant circuit operatively connected in an output circuit of that stage. Means are provided to feed back a signal from the amplified output to the input to the amplification stage at the proper phase relation and amplitude to sustain oscillations at the desired Lo frequency.

In one particular oscillator circuit having special utility in operation in the UHF range, the amplification stage may comprise transistor having a tuning circuit connected to its collector. A feedback path is provided between the collector and the emitter to initiate and sustain the desired oscillation of that transistor amplifier at a frequency determined by the resonant frequency of the tuned circuit.

To obtain the necessary oscillation-sustaining amplitude of the feedback signal, a coupling capacitor is provided in the feedback path between the output and the input terminals of the amplification stage. For oscillators operating in the UHF region, that feedback capacitance is of a small magnitude and may be provided by the equivalent interelectrode capacitances of the amplifying transistor. However, the value of the capacitance obtained in this manner is often insufficient to provide the suitably large feedback signal necessary for sustained oscillation. As a result, it is often necessary, in oscillator circuits of this type, to provide a physical capacitor, generally of a low value of capacitance.

At the high frequencies encountered in the UHF range, it is of great importance that the magnitude of the feedback capacitance be precisely determined. However, commercially available capacitors generally have tolerances of 10 percent or 20 percent from their nominal value. As a result it becomes difficult to control the output intensity of the oscillator. Capacitors with lower tolerances may be obtained, but only at a substantially higher cost. Moreover, adjustable capacitors having values low enough to be useful in these applications are not available.

It is thus desirable to be able to obtain the necessary amount of signal feedback to the amplifier input without using a conventional capacitor in that feedback path. One proposed solution to this problem is to place the conducting lead to the emitter of the amplifier transistor in proximity to the inductance of the resonant circuit so as to create a capacitance therebetween. However, the housing in which the oscillator and associated components are located is often subjected to shock and vibration. This in turn causes the emitter resistance to move with respect to the inductance. A slight but perceptible variation in the feedback capacitance occurs, resulting in the generation of microphonics by the oscillator. This produces unpleasant high frequency signals, often in the audio range, at the receiver output.

It is an object of the present invention to provide an oscillator, and particularly one used in the RF range, in which a controlled amount of capacitance is provided in the oscillator feedback path.

It is another object of the present invention to provide a high-frequency oscillator in which the amount of capacitance in the feedback path can be accurately and readily adjusted.

It is a further object of the present invention to provide a high-frequency oscillator in which the physical capacitor often required in the amplifier feedback path is replaced by an equivalent capacitor the capacitance of which is more precisely attained.

It is yet another object of the present invention to provide a high-frequency oscillator in which the feedback capacitance is defined by the relative spacing of circuit components, which relative spacing is not affected by movement of the oscillator housing.

It is a further object of the present invention to provide an oscillator in which a feedback capacitance is provided between the output and input terminals of an amplifier the magnitude of which is accurately controlled by changing the number of turns of one conductor placed around a second conductor.

It is still a further object of the present invention to provide an oscillator of the type described in which an equivalent capacitor is defined in a feedback path of the oscillator circuit from inexpensive components which provide reliable and accurate operation of the oscillator circuit.

To these ends, the oscillator comprises an amplification stage which has input and output terminals and a capacitive feedback circuit connected between these terminals. In accord with the present invention, the feedback capacitance is defined by a first conductor operatively connected to one of the amplification stage terminals and a second conductor operatively connected to the other amplification stage terminal and overlying and insulated from the first conductor. The second conductor may have a number of turns wound about the first conductor to achieve the desired amount of feed back capacitance.

In a particular embodiment of this invention as herein described, the amplification stage is in the form of a transistor having the conventional base, emitter and collector terminals, the feedback capacitance existing between the collector and the emitter terminals. The first conductor comprises the emitter resistor which is connected to the emitter terminal. A resonant circuit comprising an inductance and a capacitance, which is adapted to determine the frequency at which the oscillator is to operate, is connected to the collector terminal. The second conductor may be connected to the inductance and through that inductance to the collector terminal. The components of the oscillator are preferably contained within a housing having a rigid conducting wall serving as a ground terminal. Each of the conductors comprises a flexible lead operatively secured to the housing wall so that both of the conductors are suspended as a unit within the housing. As a result, the two conductors are positioned with respect to one another in a substantially fixed relationship and movement of the housing due to vibration, shock or the like, will not affect their relative orientation, and thus will not vary the equivalent feedback capacitance defined thereby.

To the accomplishment of the above, and to such other objects as may hereinafter appear, the present invention relates to a feedback oscillator, as defined in the accompanying claims and as described in this specification, taken together with the accompanying drawings in which:

Figure 1:
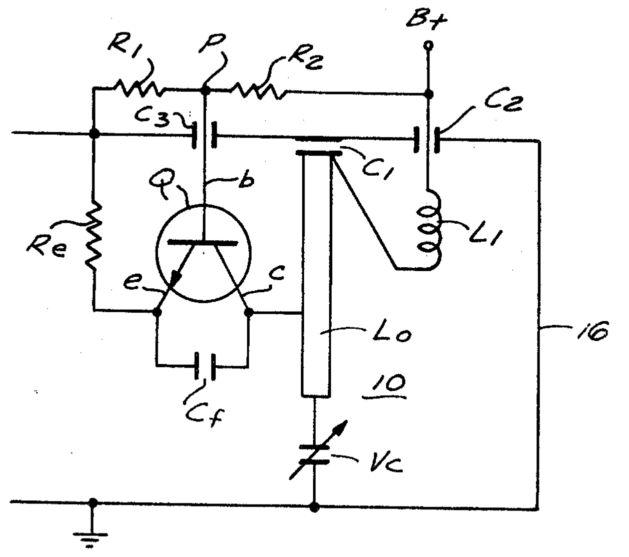
FIG. 1 PRIOR ART
FIG. 1 is a schematic circuit diagram of a typical prior art oscillator.

A typical prior art oscillator as illustrated in FIG. 1 comprises an amplification stage in the form of a transistor Q having a base terminal *b*, an emitter terminal *e*, and a collector terminal *c*. A resonant circuit 10 comprising an inductance L*o* in series with a variable capacitance V*c* is connected in the collector circuit of transistor Q between collector *c* and ground. The end of inductance L*o* remote from tuning capacitor V*c* is connected through an AC bypass disc capacitor C1 to the conductive housing wall 16, which is grounded. The collector is connected to a source of B+ potential through inductance L*o* and a series choke coil L1, the latter being connected to the B+ source (located outside the casing wall 16) through a bypass capacitor C2. A suitable operating bias is applied to the base of transistor Q through resistors R1 and R2 connected as a voltage divider between the B+ source and ground, the base being connected through a bypass capacitor C3 to a point P at the junction of resistors R1 and R2. Suitable emitter biasing is provided by an emitter resistor R*e* connected between the emitter terminal *e* and ground.

To supply the necessary feedback signal at the frequency determined by the resonant frequency of resonant circuit 10, a capacitance, here shown as capacitor C*f*, is connected between the emitter *e* and the collector *c*. In the prior art circuit of FIG. 1, that capacitance is a physical capacitor, the value of which determines the amount of the feedback signal coupled between the base and collector. For oscillation at high frequencies, such as in the UHF range, the value of that capacitor is small. The control of the value of that capacitance and thus the corresponding control of the magnitude of the feedback, is achieved only with difficulty as by the use of costly precision capacitors. Moreover, as variable capacitances are unreliable at such low capacitance values, fixed capacitances are commonly employed in the oscillator feedback path. As a result, the value of the feedback capacitance in the oscillator can only be varied by removing that capacitor and replacing it with a capacitor of a different value.

Figure 2:
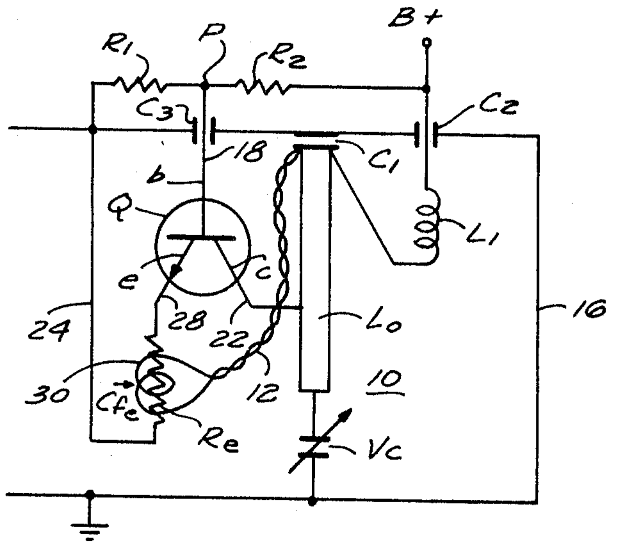
FIG. 2 is a schematic circuit diagram of an oscillator embodying features of the present invention.

The oscillator circuit of FIG. 2 is substantially the same as that of FIG. 1 and has similar components identified by identifying symbols corresponding to those used in FIG. 1. The feedback capacitor C*f* has, however, been replaced, in accordance with the present invention, by an equivalent capacitance C*fe* obtained by placing a portion of an insulated conductor 12 in overlying relationship with the resistor R*e*. Conductor 12 is connected at one of its ends to the inductor L*o* and through inductor L*o* to the collector *c* of transistor Q. Resistor R*e* is connected to the emitter *e* of transistor Q, so that the equivalent capacitance C*fe* is operatively connected in feedback relationship between the collector and emitter (the output and input) terminals of transistor Q. A number of turns (e.g. two or three) of conductor 12 are wound about the body portion of the resistor R*e* (FIG. 3) to create a capacitance having a value effective to couple a sufficient feedback signal and to sustain oscillations at transistor Q. The amount of that capacitance can be very accurately controlled by the number of turns of winding 12 wound about the resistor R*e*. Thus, the feedback capacitance may be increased by increasing that number of turns and reduced by decreasing that number of turns.

Figure 3:
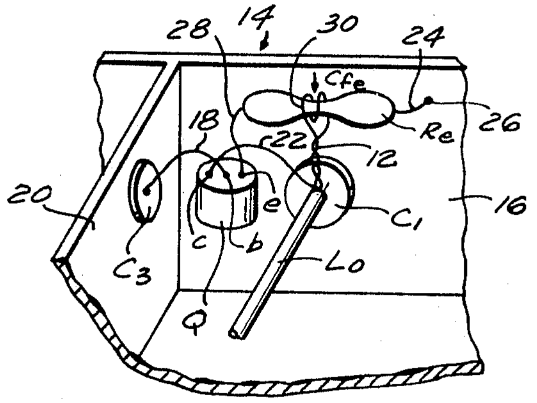
FIG. 3 is a fragmentary perspective view of the local oscillator portion of an exemplary receiver comprising some of the components of the circuit of FIG. 2.

FIG. 3 illustrates the manner in which some of the components of the circuit of FIG. 2 are typically arranged within a housing 14 of the tuning section of a UHF receiver. As shown, the disc capacitor C1 is secured to the grounded wall 16 of housing 14, and one end of the inductor L*o* is fixed to that capacitor. The other end of inductor L*o* is also secured to another wall of housing 14 (not shown) via tuning capacitor V*c*. In this manner, inductor L*o* is rigidly secured within the housing 14. The transistor Q is suspended within housing 14 by having its flexible base lead 18 connected to capacitor C3 which is fixed to wall 20 of housing 14, and its collector lead 22 is connected to the inductor L*o*. One flexible lead 24 of emitter resistor R*e* is connected to wall 16 as by soldering at 26, and its other flexible lead 28 is connected to the emitter terminal *e* of transistor Q. A number of turns 30 of conductor 12 (here shown as two) are wound about emitter resistor R*e*, the number of these turns corresponding to the desired value of the feedback capacitance C*fe* to be provided between the collector and emitter terminals of transistor Q. The free ends of conductor 12 are then twisted about one another to minimize unwanted radiation therefrom, and are connected to inductor L*o* at the location at which the latter is connected to capacitor C1. Thus, conductor 12 and particularly that portion thereof wound about resistor R*e* may also be considered as being suspended in housing 14. As a result, the resistor R*e* and conductor 12 will move substantially as a unit in the event of any movement of housing 14, and the relative spacing of the conductor turns 30 about resistor R*e* will remain substantially constant. The resultant equivalent feedback capacitance C*fe* defined thereby is thus substantially unaffected by the movement of the housing, thus preventing production of undesired microphonics.

This invention has provided an improved oscillator circuit in which a feedback capacitance is provided between the output and input terminals of the amplifier portion of that circuit. That feedback capacitance is defined by a insulated conductor having a predetermined number of turns thereof overlying a resistor commonly provided in the emitter circuit of the amplifier. The amount of the feedback capacitance can be controlled by varying the number of turns of the conductor placed about that resistor. The operation of the oscillator can thus be precisely controlled to provide the desired amplitude of oscillator output merely by providing a relatively minor and inexpensive addition to the known oscillator circuits and making use in large part of already existing components (the emitter resistance). The arrangement of the components defining the equivalent feedback capacitance within the receiver housing is such that said capacitance remains substantially unaffected by possible movement of these components due to vibration or shock, thereby preventing the production of microphonics.

While only a single embodiment of this invention has been herein specifically disclosed, it will be apparent that variations may be made thereto without departing from the spirit and scope of the invention as defined in the following claims.

I claim:

1. In an r-f oscillator circuit comprising amplifier means having an input and an output terminal, and a feedback circuit having capacitance means connected between said input and output terminals; the improvement which comprises, a first conductor operatively connected to one of said terminals, and a second conductor operatively connected to the other of said terminals and having portion overlying and insulated from said first conductor to define therewith an equivalent capacitance defining at least a part of said feedback circuit capacitance means, one of said conductors being conductively connected in said circuit at only one end thereof and the other of said conductors being conductively connected at opposite ends thereof to different points in the circuit so as to define a means carrying current from one of said circuit points to the other.

2. The improvement of claim 1, in which a plurality of turns of said second conductor are wound about said first conductor.

3. In the circuit of claim 1, an oscillatory circuit comprising an inductance and capacitance connected to said output terminal, said second conductor being connected at said one end thereof to said inductance and through said inductance to said output terminal.

4. The improvement of claim 3, further comprising a relatively rigid inductance line operatively connected to said output terminal having each of its ends operatively secured to said housing, said second conductor being connected at said one end thereof to said inductance line, said inductance line defining said inductance.

5. In an r-f oscillator circuit comprising amplifier means having an input and an output terminal, and a feedback circuit having capacitance means connected between said input and output terminals; the improvement which comprises, a first conductor operatively connected to one of said terminals, and a second conductor operatively connected to the other of said terminals and having a portion overlying and insulated from said first conductor to define therewith an equivalent capacitance defining at least a part of said feedback circuit capacitance means, at least one of said conductors being conductively connected in said circuit at only one end thereof, a plurality of turns of said second conductor being wound about said first conductor, said amplifier means comprising a transistor having base, emitter and collector terminals, said latter two terminals respectively defining said input and output terminals, said first conductor comprising a resistor operatively connected to said emitter terminals, said second conductor being wound about said resistor and constituting said one of said conductors.

6. In the circuit of claim 5, an oscillatory circuit comprising an inductance and capacitance connected to said output terminal, said second conductor being connected at said one end thereof to said inductance and through said inductance to said output terminal.

7. The improvement of claim 6, further comprising a relatively rigid inductance line operatively connected to said collector having each of its ends operatively secured to said housing, said second conductor being connected at said one end thereof to said inductance line.

8. In an r-f oscillator circuit comprising amplifier means having an input and an output terminal, and a feedback circuit having capacitance means connected between said input and output terminals; the improvement which comprises, a first conductor operatively connected to one of said terminals, and a second conductor operatively connected to the other of said terminals and having a portion overlying and insulated from said first conductor to define therewith an equivalent capacitance defining at least a part of said feedback circuit capacitance means, at least one of said conductors being conductively connected in said circuit at only one end thereof, said amplifier means comprising a transistor having base, emitter and collector terminals, said letter two terminals respectively defining said input and output terminals, said first conductor comprising a resistor operatively connected to said emitter terminal, said second conductor being wound about said resistor and constituting said one of said conductors.

9. In the circuit of claim 8, an oscillatory circuit comprising an inductance and capacitance connected to said output terminal, said second conductor being connected as said one end thereof to said inductance and through said inductance to said output terminal.

10. The improvement of claim 9, further comprising a relatively rigid inductance line operatively secured to said housing, said second conductor being connected at said one end thereof to said inductance line.